United States Patent [19]

Atsumi et al.

[11] Patent Number: 5,046,048

[45] Date of Patent: Sep. 3, 1991

[54] SEMICONDUCTOR INTEGRATED CIRCUIT INCLUDING OUTPUT BUFFER

[75] Inventors: Shigeru Atsumi; Sumio Tanaka, both of Tokyo; Junichi Miyamoto, Yokohama; Nobuaki Ohtsuka, Yokohama; Keniti Imamiya, Yokohama, all of Japan

[73] Assignee: Kabushiki Kaisha Toshiba, Kawasaki, Japan

[21] Appl. No.: 379,280

[22] Filed: Jul. 13, 1989

[30] Foreign Application Priority Data

Jul. 15, 1988 [JP] Japan ................................ 63-176721
Feb. 21, 1989 [JP] Japan ................................ 1-40536

[51] Int. Cl.$^5$ .............................................. G11C 7/00
[52] U.S. Cl. .................................. 365/201; 365/189.05
[58] Field of Search .............. 365/201, 189.05, 189.03, 365/230.08

[56] References Cited

U.S. PATENT DOCUMENTS 4,635,234  1/1987  Yamaguchi ........................ 365/233
4,644,265  2/1987  Davidson et al. ................. 324/73 R
4,733,168  3/1988  Blackenship et al. ............ 324/73 R
4,752,729  6/1988  Jackson et al. .................... 324/73 R
4,899,313  2/1990  Kumanoya et al. ................ 365/201

FOREIGN PATENT DOCUMENTS

0087006 A3  2/1983  European Pat. Off. .
0255449 A1  7/1987  European Pat. Off. .

Primary Examiner—Joseph A. Popek
Attorney, Agent, or Firm—Finnegan, Henderson, Farabow, Garrett, and Dunner

[57] ABSTRACT

A semiconductor integrated circuit having a test mode in addition to a normal mode, includes a mode detecting circuit for detecting a state of each mode and generating a mode signal, a prebuffer circuit for receiving the mode signal generated by the mode detecting circuit, amplifying an input signal by using an output driving capacity corresponding to the mode signal, and outputting the amplified signal, and an output buffer circuit for receiving an output from the prebuffer circuit and outputting data outside the integrated circuit.

20 Claims, 9 Drawing Sheets

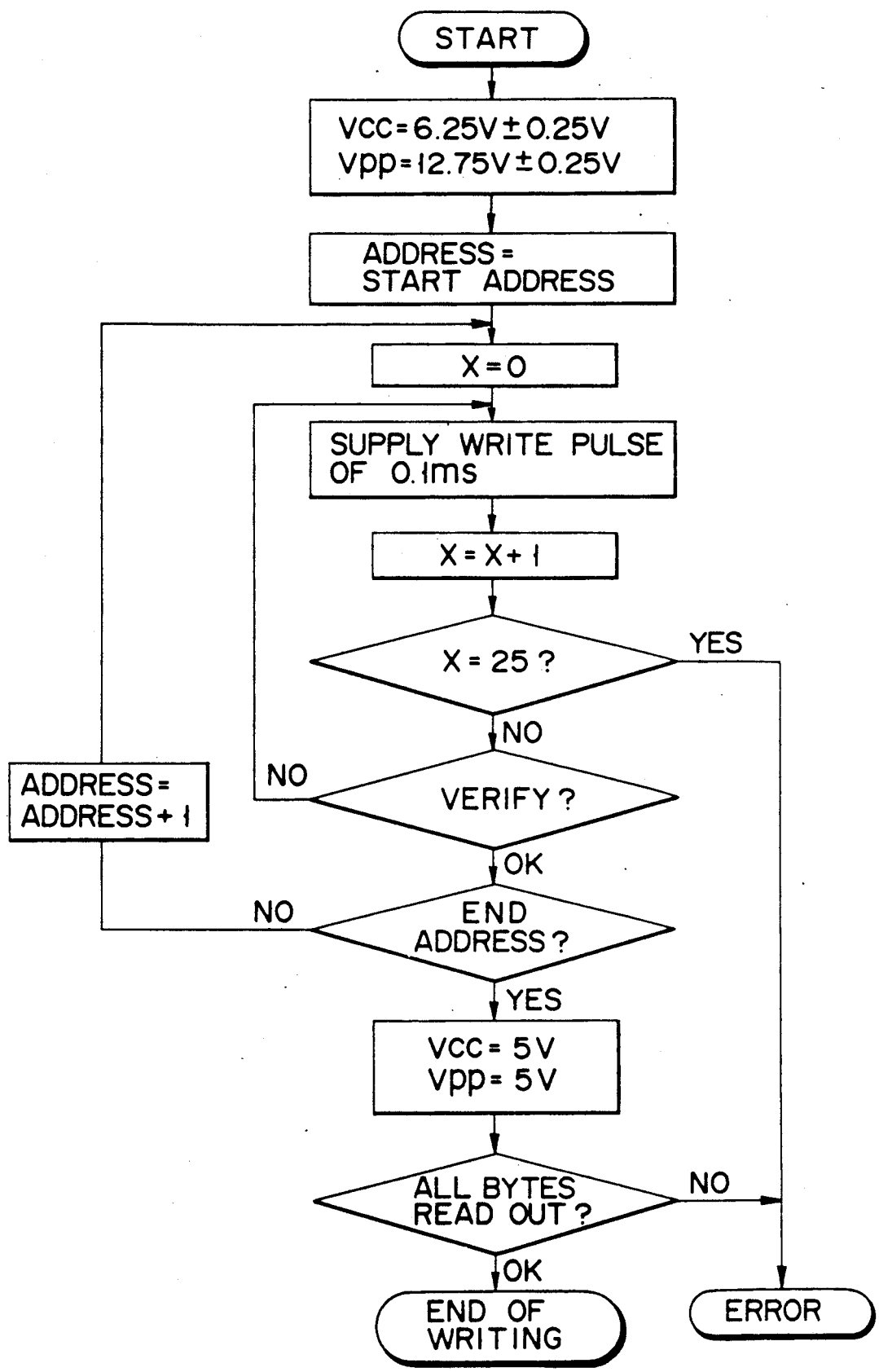
F I G. 5

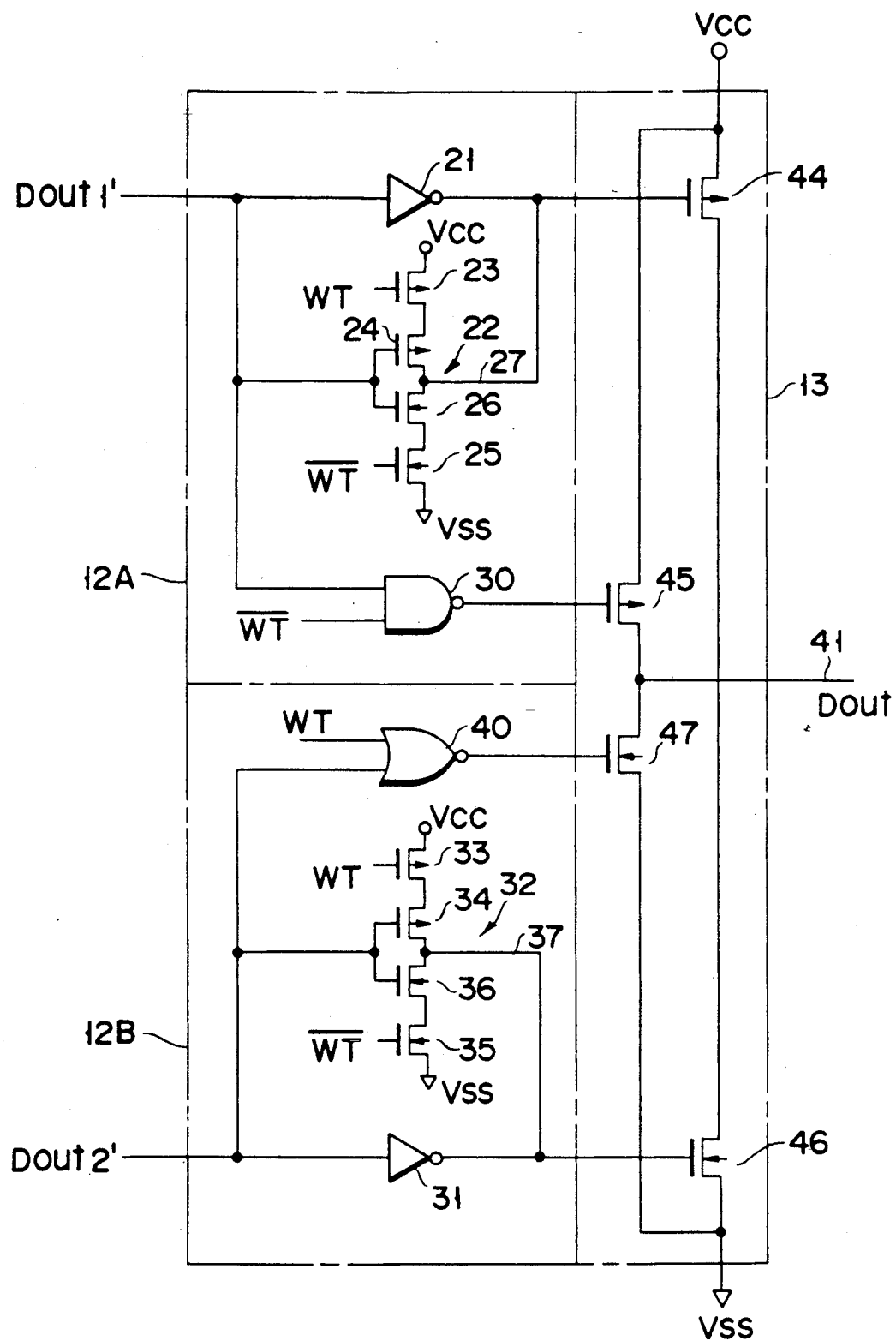
F I G. 10

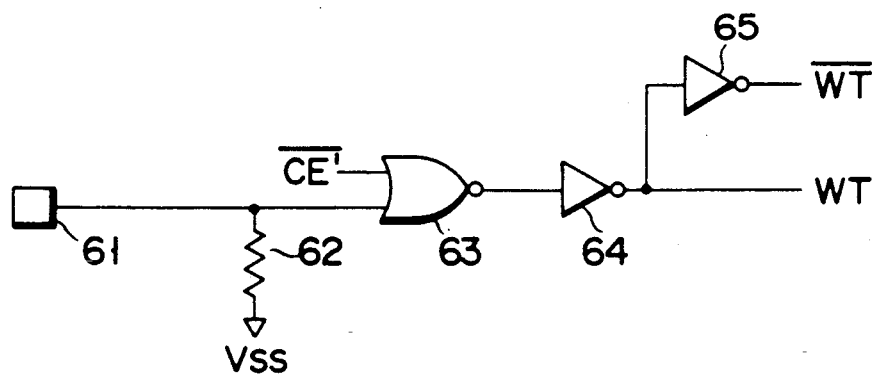
F I G. 13
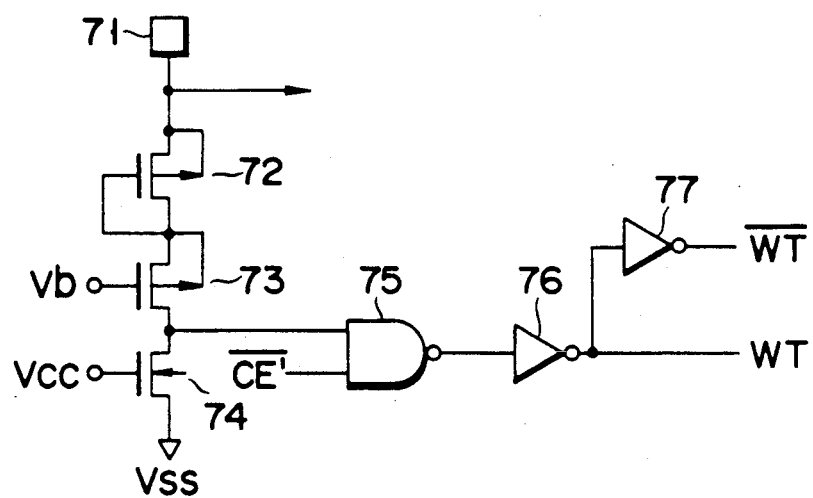
F I G. 14

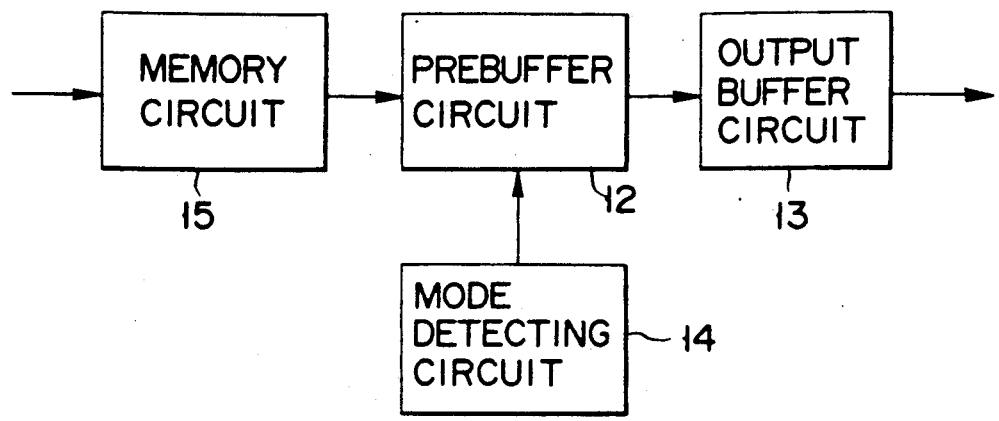
F I G. 15
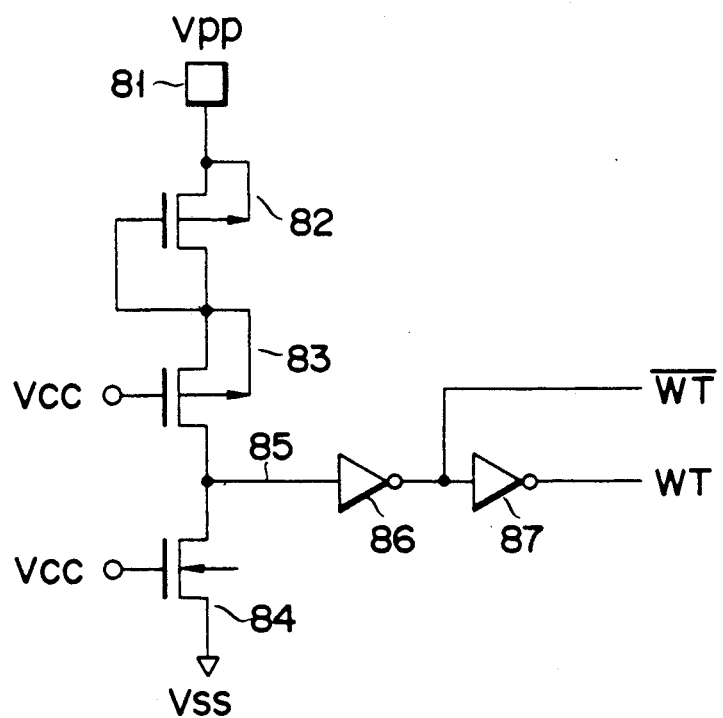
F I G. 16

5,046,048

SEMICONDUCTOR INTEGRATED CIRCUIT INCLUDING OUTPUT BUFFER

BACKGROUND OF THE INVENTION

1. Field of the Invention

The present invention relates to a semiconductor integrated circuit including an output buffer and, more particularly, to a semiconductor integrated circuit designed to reduce noise generated by an output buffer.

2. Description of the Related Art

A semiconductor integrated circuit (IC), especially a digital IC such as a memory IC or a logic IC receives an external signal or data, performs internal processing such as arithmetic and logic operations, and externally outputs the processing result. For example, a memory IC receives an address or control signal as an input signal. In this memory IC, data prestored at an address designated in accordance with an address signal is read out and output as an output signal from a data output pin. In the memory IC, a large load capacitor having a capacitance of, e.g., 100 pF must be driven by an output buffer arranged at the output stage of the IC. For this reason, an output buffer having a relatively large current driving capacity must be used. The load driving capacity of the output buffer for an IC used in a field requiring higher operation speed must be increased accordingly. This is because the time required for driving an external load capacity is treated as part of an access time.

One of the problems posed during a practical use or a test operation of an IC is generation of noise. That is, when a current flowing through the output buffer in the IC is instantaneously changed, an electromotive force is generated in the power source wiring in the IC, thus generating so-called power source noise.

FIG. 1 is a circuit diagram showing a schematic arrangement of an IC mounted on a wiring board. Referring to FIG. 1, a region enclosed by a dotted line corresponds to an IC 90. The IC 90 comprises an internal circuit 91 to which an input voltage Vin is applied and an output buffer 94 having an output stage constituted by p- and n-channel MOSFETs 92 and 93 and adapted to be driven by an output from the internal circuit 91.

Reference symbol Vcc denotes a positive power source potential of, e.g., 5 V to be applied to the wiring board; and Vss, a ground potential of 0 V to be applied to the wiring board. The potentials Vcc and Vss to be applied to the board are applied to the inside of the IC through inductance components L1 and L2 as the sums of inductances which are parasitically present in the wiring on the board, the wiring in the IC, the bonding wires in the IC, and the like. A capacitance C1 of an external load is connected between a signal output terminal 95 of the IC and the ground potential Vss; and an internal capacitance C2 of the IC itself, between the power source potential Vcc and the ground potential Vss.

The capacitance C1 as an external load to be driven by the output buffer 94 in the IC has a large capacitance of, e.g., about 100 pF, as described above. The above power source noise is generated when the capacitance C1 is driven by the output buffer 94. Assume that the IC shown in FIG. 1 is a memory IC and its input voltage Vin corresponds to one bit of an address signal consisting of a plurality of bits. As indicated by a timing chart in FIG. 2, when address signals are switched, output data Dout from the output buffer 94 is switched from "H" level to "L" level. This operation is called, for example, a "0"-read operation. In this operation, the charge prestored in the capacitance C1 is discharged to the ground potential Vss when the n-channel MOSFET 93 as an output stage of the output buffer 94 is turned on. As a result, the output data Dout is changed from "1" level to "0" level. At this time, a current flowing through the wire of the ground potential Vss changes as shown in FIG. 2. In this case, due to a rate of change (with respect to time) dIss/dt of the ground current Iss and the above inductance component L2, a counter electromotive force L2·dIss/dt is generated in the wire of the ground potential. That is, in the IC, the ground potential Vss rises immediately after the n-channel MOSFET 93 in the output buffer 94 is turned on. Thereafter, the ground potential Vss is attracted to the negative polarity with a decrease in ON current. When no ON current flows, the potential Vss returns to the original 0 V and is stabilized.

In contrast to this, in a "1"-read operation when the output data Dout from the output buffer 94 is switched from "0" level to "1" level, the p-channel MOSFET 92 in the output buffer 94 is turned on to charge the capacitance C1, thereby changing the output data Dout from "0" level to "1" level. At this time, a current Icc flowing through the wire of the power source potential Vcc changes as shown in FIG. 2. In this case, due to a rate of change dIcc/dt of the current Icc and the inductance component L1, a counter electromotive force L1·dIcc/dt is generated in the wire of the power source potential, and the power source potential Vcc changes as shown in FIG. 2.

As described above, the power source potential Vcc or the ground potential Vss in the IC is changed upon operation of the output buffer. In contrast to this, the input potential Vin is always kept constant regardless of changes in the potential Vcc or Vss on the board. This is because, as shown in FIG. 1, the power source potential Vcc and the ground potential Vss of the other IC (not shown) which generates the input potential Vin are isolated from the IC on the board so as to constitute a different system, and no interaction is present between the power source potentials or ground potentials of the ICs. For this reason, variations in the power source potential Vcc or the ground potential Vss in the IC on the board may cause an error of the IC on the board.

For example, as indicated by a timing chart in FIG. 3, when the input voltage Vin is set at a high potential and a potential difference (Vin−Vss) between the input voltage Vin and the ground potential Vss becomes smaller than a threshold voltage VIL on the low-level side of the input-stage transistor of the IC upon variation in the ground potential Vss in the IC, the IC detects the input voltage Vin at this time as a low-level potential. Therefore, at this time, erroneous data is output, and a failure occurs in the IC.

In order to suppress noise which is generated when the output buffer is operated in the above-described manner, the following two methods can be provided:

(a) to reduce the rate of change dI/dt of the ground current Iss or the power source current Icc, and (b) to reduce the inductance components L1 and L2.

Furthermore, in order to reduce the rate of change dI/dt, the following two methods can be provided:

(1) to reduce the steepness at the leading or trailing edge of the waveform of an input signal to be supplied to the output buffer, and (2) to reduce the element size of each MOSFET constituting an output stage of the output buffer so as to interfere with the flow of a large current Method (1) is equivalent to delaying of the timing at which each MOSFET in the output buffer is turned on upon switching of the output data Dout. Method (2) causes a decrease in load driving capacity of the output buffer. In both methods (1) and (2), noise suppression is realized by delaying an access time.

Method (a) of reducing dI/dt is to be employed by a manufacture of ICs, whereas method (b) of reducing inductance components is to be employed by a designer of boards. That is, by designing the length of the wiring on a board to be minimum, an inductance component can be reduced. It is not preferable for an IC designed to be operated at high speed to delay the access time. In general, an output buffer is designed to drive a load capacitor as fast as possible, and noise suppression is realized by optimization of a board.

In order to obtain a high-speed IC, therefore, generation of a certain amount of noise in an output buffer must be accepted, and a board must be designed not to cause an operation error in spite of the noise.

In this case, noise generated during a wafer test such as a die sort test poses the most serious problem. Such a wafer test is generally performed by a test system having an arrangement shown in FIG. 4. More specifically, input data Din, a power source potential Vcc, and a ground potential Vss from a tester 100 are applied to a wafer-like IC 90 set on a probe 101. Output data Dout from the IC 90 is then supplied to the tester 100. The distance from the tester 100 to the probe 101 sometimes becomes very large, e.g., 1 m or more. For this reason, inductance components in the respective wires between the tester and the probe become much larger than those on the board. In low- and intermediate-speed ICs, since generation of noise is suppressed by method (a) described above, substantially no operation error need be considered even in a wafer test operation. However, in high-speed ICs designed assuming that noise suppression can be satisfactorily realized on boards, generation of noise in a wafer test operation poses a problem. More specifically, since a high-speed IC is designed such that the rate of change dI/dt becomes large, variations in the power source potential Vcc and the ground potential Vss to be applied to the IC are greatly increased. For this reason, measurement of such an IC may not be satisfactorily performed by a normal test system using presently available testers and probes.

EPROMs and one-time PROMs (OTPs) are known as programmable memory ICs using nonvolatile transistors or the like for memory cells. In such a nonvolatile memory IC, it is known that power source noise tends to be generated when data programming is performed by using a programmer. Hence, noise generated in this programming operation poses a problem.

Programming of data in an EPROM is performed in accordance with, e.g., the procedure of a flow chart shown in FIG. 5. More specifically, a power source potential Vcc and a high power source voltage potential Vpp for a write operation are respectively set to be 6.25 V±0.25 V and 12.75 V±0.25 V. In this state, data programming is performed in units of memory cell bits. Upon programming, verification is performed. After data writing is satisfactorily performed in units of memory cells, the potentials Vcc and Vpp are set at 5 V. The data are read out from all the memory cells to be verified. The word "verification" means an operation of reading out programmed data and confirming it.

As described above, in programming, an operation of reading out data in units of bits while the power source potential Vcc is set at about 6.25 V, and an operation of reading out data in units of bits while the high power source voltage potential Vpp is set at about 12.75 V are performed.

Various types of EPROM programmers are commercially available. However, all of such programmers are designed for low-noise, intermediate- and low-speed memory ICs, and no satisfactory countermeasure against noise has been taken so as to enable programming of high-speed ICs which generate very large noise. In addition, the amount of noise is increased with an increase in the power source potential Vcc.

In the above-described programming operation, a problem is posed especially in a verify operation of reading out data in units of bits after data writing is performed while the power source potential Vcc is set at about 6.25 V. A high potential of 6.25 V causes an output buffer to generate very large noise. For this reason, in addition to the phenomenon that the power source potential Vcc and the ground potential Vss greatly vary to change the threshold voltage of the transistor on the input stage, power source noise generated by the output buffer may adversely affect a sense amplifier in a memory, thereby causing an operation error in the sense amplifier.

SUMMARY OF THE INVENTION

It is, therefore, an object of the present invention to provide a semiconductor IC including an output buffer, which can obtain a sufficiently high operation speed in practical use, can suppress generation of noise in a test operation, and allows satisfactory measurement even by using a normal test system.

It is another object of the present invention to provide a semiconductor IC including an output buffer, which can obtain a sufficiently short access time in a normal data read operation, can suppress generation of noise in a verify operation in programming, and allows a satisfactory write operation using a conventional programmer.

According to the present invention, there is provided a semiconductor integrated circuit having a test mode in addition to a normal mode, comprising mode detecting means for detecting a state of each mode and generating a mode signal, prebuffer means for receiving the mode signal generated by the mode detecting means, amplifying an input signal by using an output driving capacity corresponding to the mode signal, and outputting the amplified signal, and output buffer means for receiving an output from the prebuffer means and outputting data outside the integrated circuit.

In addition, according to the present invention, there is provided a semiconductor integrated circuit having a test mode in addition to a normal mode, comprising mode detecting means for detecting a state of each mode and generating a mode signal, output buffer means whose driving capacity with respect to an external load is selectively set to drive the external load by a selected driving capacity, thereby outputting data outside the integrated circuit, and prebuffer means for receiving the mode signal generated by the mode detecting means, selecting a driving capacity of the output buffer means in accordance with the mode signal, amplifying an input signal by using an output driving capacity corresponding to the mode signal, and supplying the amplified output to the output buffer means.

Moreover, according to the present invention, there is provided a semiconductor integrated circuit having a test mode in addition to a normal mode, comprising mode detecting means for detecting a state of each mode and generating a mode signal, output buffer means whose driving capacity with respect to an external load is selectively set to drive the external load by a selected driving capacity, thereby outputting data outside the integrated circuit, and prebuffer means for receiving the mode signal generated by the mode detecting means, selecting a driving capacity of the output buffer means in accordance with the mode signal, amplifying an input signal, and supplying the amplified output to the output buffer means.

BRIEF DESCRIPTION OF THE DRAWINGS

FIG. 5 is a flow chart showing an operation procedure for programming data in an EPROM;

FIG. 10 is a circuit diagram showing a detailed arrangement of a part of a semiconductor IC according to a third embodiment of the present invention;

FIG. 13 is a circuit diagram showing a detailed arrangement of a part of the circuit of each of the above embodiments;

FIG. 14 is a circuit diagram showing a detailed arrangement of a part of the circuit of each of the above embodiments;

FIG. 15 is a block diagram showing a schematic arrangement of a semiconductor IC according to another embodiment of the present invention; and FIG. 16 is a circuit diagram showing a detailed arrangement of a part of the semiconductor IC in FIG. 15.

DETAILED DESCRIPTION OF THE PREFERRED EMBODIMENTS

Figure 6:
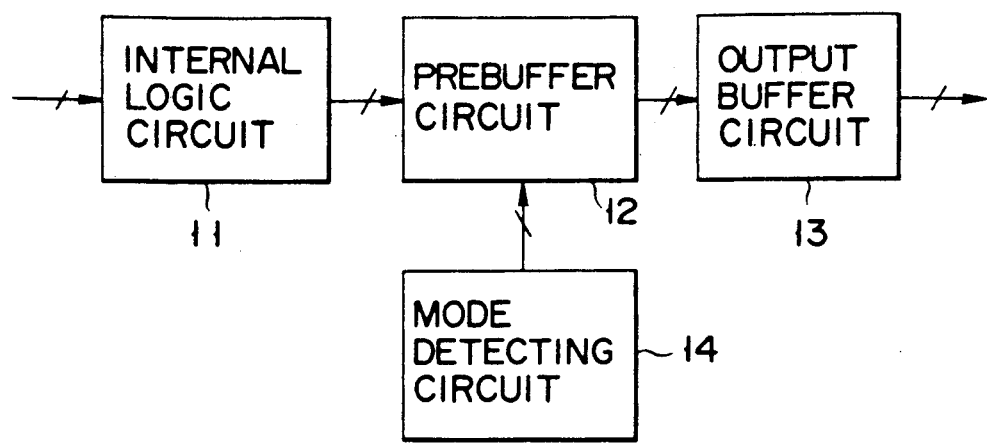
FIG. 6 is a block diagram showing a schematic arrangement of a semiconductor IC according to a first embodiment of the present invention.

Embodiment of the present invention will be described below with reference to the accompanying drawings. FIG. 6 is a block diagram showing a schematic arrangement of a semiconductor IC according to the present invention. Referring to FIG. 6, reference numeral 11 denotes an internal logic circuit for generating output data in accordance with input data. Two operation modes, i.e., a normal operation mode and a wafer test mode are set in the internal logic circuit 11. An output from the internal logic circuit 11 is supplied to a prebuffer circuit 12. The prebuffer circuit 12 amplifies the output from the circuit 11. An output from the prebuffer circuit 12 is supplied to an output buffer circuit 13. The output buffer circuit 13 outputs data outside the IC in accordance with the output from the circuit 12.

Reference numeral 14 denotes a mode detecting circuit. The mode detecting circuit 14 detects the two operation mode states of the internal logic circuit 11 on the basis of an external input signal. A detection output from the mode detecting circuit 14 is supplied to the prebuffer circuit 12. The driving capacity of the prebuffer circuit 12 with respect to the output buffer circuit 13 or that of the output buffer circuit 13 with respect to an external load is set in accordance with the detection output from the mode detecting circuit 14.

Figure 7:
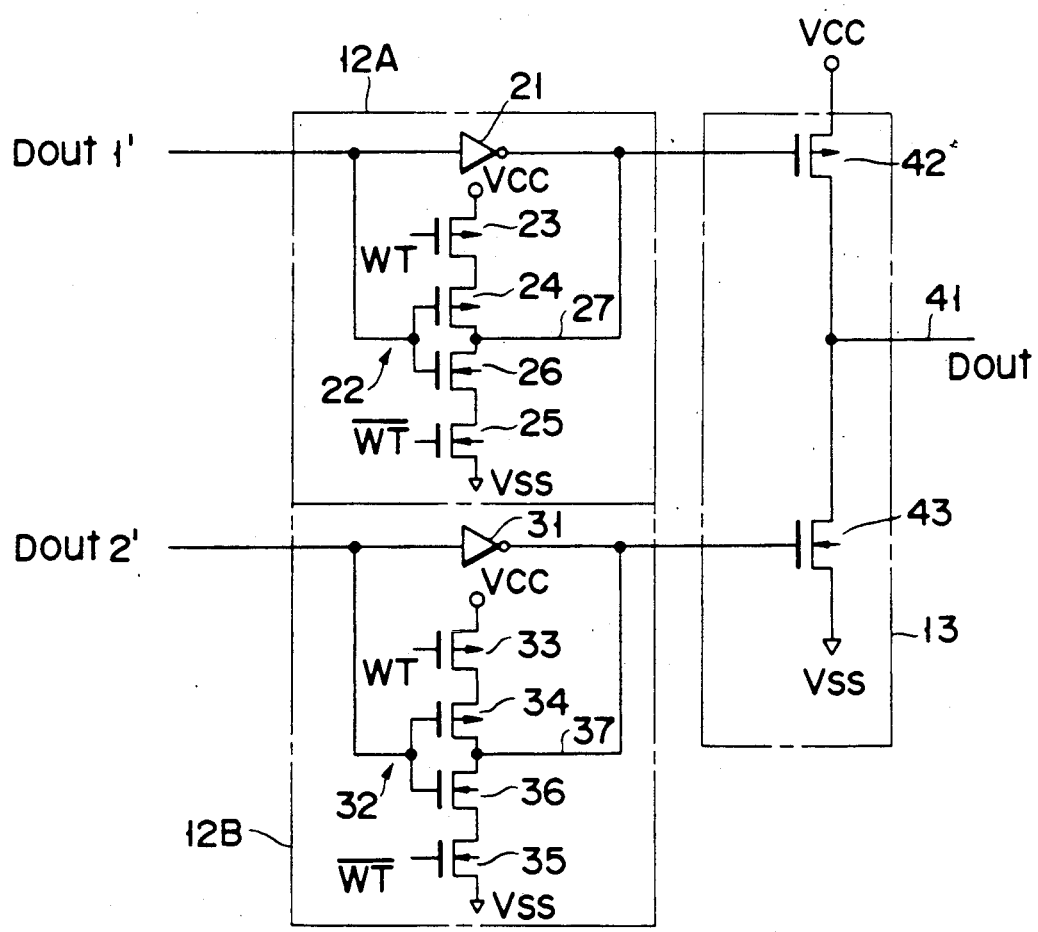
FIG. 7 is a circuit diagram showing a detailed arrangement of a part of the semiconductor IC according to the first embodiment.

FIG. 7 is a circuit diagram showing detailed arrangements of the prebuffer circuit 12 and the output buffer circuit 13 in the circuit shown in FIG. 6. In this case, FIG. 7 shows only an arrangement of a circuit associated with one-bit data. However, identical circuits corresponding to the number of required bits are arranged.

The prebuffer circuit 12 comprises a first prebuffer circuit 12A and a second prebuffer circuit 12B.

The first prebuffer circuit 12A includes a CMOS inverter circuit 21 for receiving one internal data Dout 1' output from the internal logic circuit 11, and a CMOS inverter circuit 22 for receiving the internal data Dout 1'. The CMOS inverter circuit 22 is controlled in accordance with a wafer test signal WT and its inverted signal $\overline{WT}$, and has an output terminal commonly connected to the output terminal of the CMOS inverter 21. The CMOS inverter circuit 22 has two enhancement type p-channel MOSFETs 23 and 24, and two enhancement type n-channel MOSFETs 25 and 26. The source of the MOSFET 23 is connected to a positive power source potential Vcc of, e.g., 5 V. The wafer test signal WT is supplied to the gate of the MOSFET 23. The source and the drain of the MOSFET 24 are respectively connected to the drain of the MOSFET 23 and an output terminal 27 of the CMOS inverter circuit 22. The internal data Dout 1' is supplied to the gate of the MOSFET 24. The source of the MOSFET 25 is connected to a ground potential Vss of 0 V. The wafer test signal $\overline{WT}$ is supplied to the gate of the MOSFET 25. The source and the drain of the MOSFET 26 are respectively connected to the drain of the MOSFET 25 and the output terminal 27. The internal data Dout 1' is supplied to the gate of the MOSFET 26.

The second prebuffer circuit 12B includes a CMOS inverter circuit 31 for receiving the other data Dout 2' output from the internal logic circuit 11, and a CMOS inverter circuit 32 for receiving the internal data Dout 2'. The CMOS inverter circuit 32 is controlled in accordance with the wafer test signal WT and the inverted signal $\overline{WT}$, and has an output terminal commonly connected to the output of the CMOS inverter circuit 31. The CMOS inverter circuit 32 has two enhancement type p-channel MOSFETs 33 and 34, and two enhancement type n-channel MOSFETs 35 and 36. The source of the MOSFET 33 is connected to the power source potential Vcc. The wafer test signal WT is supplied to the gate of the MOSFET 33. The source and the drain of the MOSFET 34 are respectively connected to the drain of the MOSFET 33 and an output terminal 37 of the CMOS inverter circuit 32. The internal data Dout 2' is supplied to the gate of the MOSFET 34. The source of the MOSFET 35 is connected to the ground potential Vss. The wafer test signal $\overline{WT}$ is supplied to the gate of the MOSFET 35. The source and the drain of the MOSFET 36 are respectively connected to the drain of the MOSFET 35 and the output terminal 37. The internal data Dout 2' is supplied to the gate of the MOSFET 36.

The output buffer circuit 13 comprises a p-channel MOSFET 42 having a source connected to the power source potential Vcc and a drain connected to an output terminal 41 for the data Dout, and an n-channel MOSFET 43 having a source connected to the ground potential Vss and a drain connected to the output terminal 41. An output from the first prebuffer circuit 12A is supplied to the gate of the MOSFET 42. An output from the second prebuffer circuit 12B is supplied to the gate of the MOSFET 43.

In the circuit of this embodiment, the conductances of the MOSFETs 42 and 43 in the output buffer circuit 13 are set to be sufficiently large so as to charge and discharge an external load capacitance (not shown) connected to the output terminal 41 at high speed. In addition, in the first prebuffer circuit 12A, the conductances of the respective MOSFETs are set such that the driving capacities of the two CMOS inverter circuits 21 and 22 with respect to the gate of the p-channel MOSFET 41 are set at a ratio of, e.g., 1 to 9. Similarly, in the second prebuffer circuit 12B, the conductances of the respective MOSFETs are set such that the driving capacities of the CMOS inverter circuits 31 and 32 with respect to the gate of the n-channel MOSFET 43 are set at a ratio of, e.g., 1 to 9.

In the circuit having the above-described arrangement, the wafer test signal WT and the inverted signal $\overline{WT}$ are respectively set at "L" level and "H" level during a normal operation. As a result, in the first prebuffer circuit 12A, both the CMOS inverter circuits 21 and 22 are operated, and the internal data Dout 1' is inverted by the two CMOS inverter circuits 21 and 22. The inverted data is then supplied to the gate of the p-channel MOSFET 41 in the output buffer circuit 13. Similarly, in the second prebuffer circuit 12B, both the CMOS inverter circuits 31 and 32 are operated, and the internal data Dout 2' is inverted by the two CMOS inverter circuits 31 and 32. The inverted data is then supplied to the gate of the n-channel MOSFET 43 in the output buffer circuit 13. In this case, if one internal data Dout 1' is set at "1" level, the output level of the first prebuffer circuit 12A is quickly driven to "0" level by the two CMOS inverter circuits 21 and 22. As a result, the p-channel MOSFET 42 in the output buffer circuit 13 is quickly turned on, and the data Dout output from the output terminal 41 quickly rises to "1" level. In contrast to this, if the other internal data Dout 2' is set at "0" level, the output level of the second prebuffer circuit 12B is quickly driven to "1" level by the two CMOS inverter circuits 31 and 32. As a result, the n-channel MOSFET 43 in the output buffer circuit 13 is quickly turned on, and the data Dout output from the output terminal 41 quickly falls to "0" level. That is, a sufficiently high operation speed can be obtained in the normal operation mode.

An operation of a wafer test will be described below. In the wafer test mode, the wafer test signal WT and the inverted signal $\overline{WT}$ are respectively set a "1" level and "0" level. At this time in the first prebuffer circuit 12A, only the CMOS inverter circuit 21 is operated, and the internal data Dout 1' is inverted The inverted data is then supplied to the gate of the MOSFET 42 in the output buffer circuit 13. Similarly, in the second prebuffer circuit 12B, only the COMS inverter circuit 31 is operated, and the internal data Dout 2' is inverted. The inverted data is then supplied to the gate of the MOSFET 43 in the output buffer circuit 13.

Figure 1:
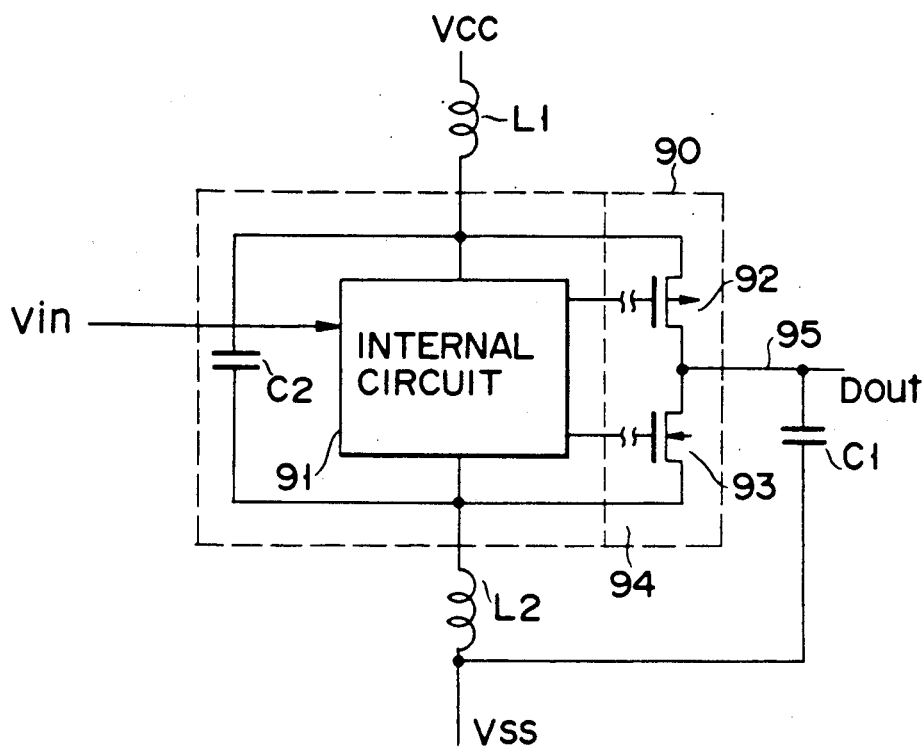
FIG. 1 is a circuit diagram showing a schematic arrangement of a semiconductor IC mounted on a wiring board.
Figure 2:
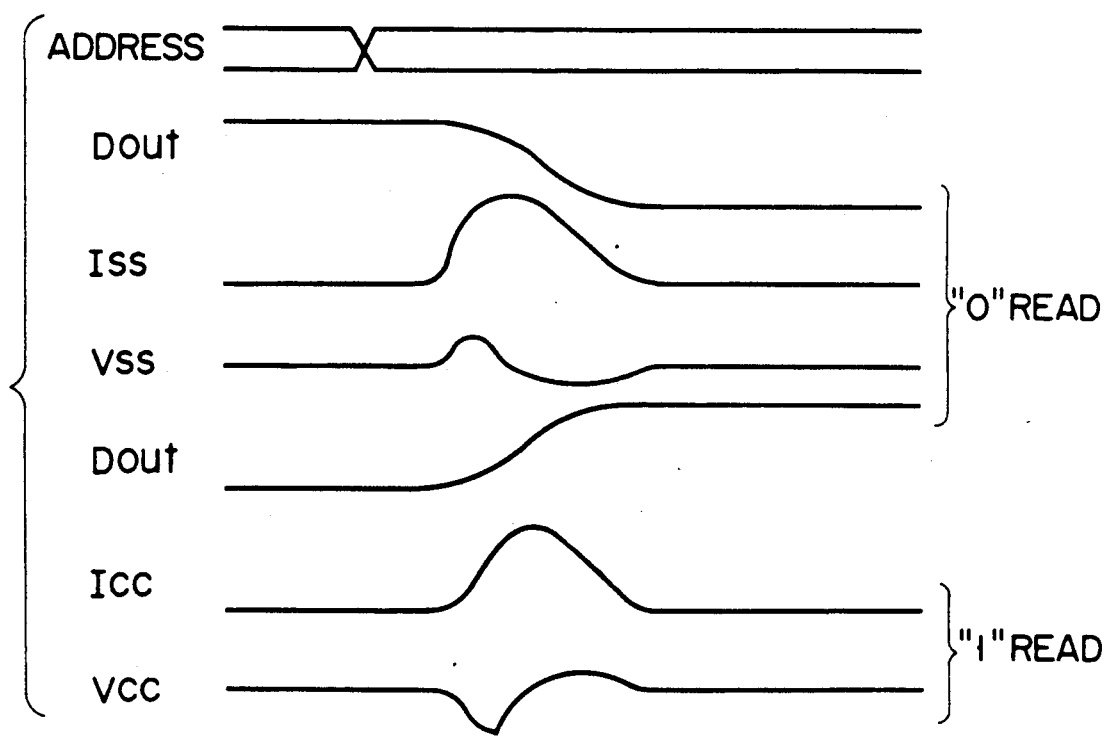
FIG. 2 is a timing chart of the circuit in FIG. 1.
Figure 3:
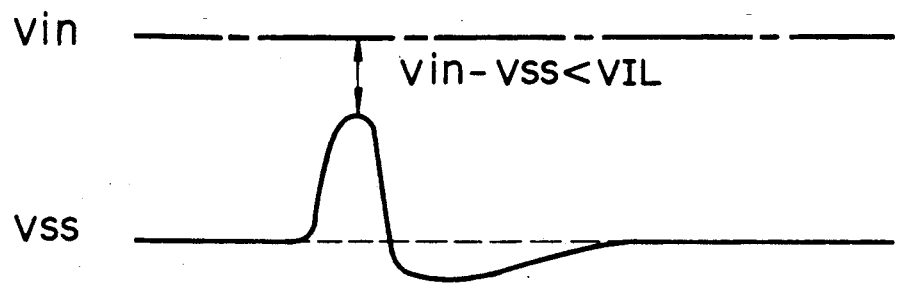
FIG. 3 is a timing chart showing the waveforms of signals in the circuit of FIG. 1.
Figure 4:
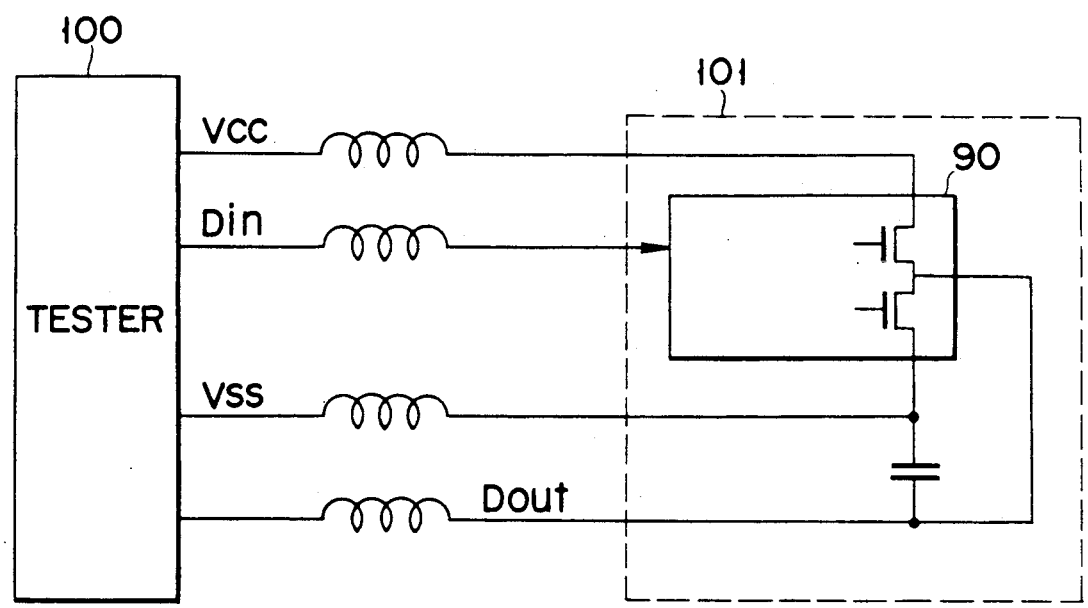
FIG. 4 is a circuit diagram showing a test system used to test an IC.

In this case, the load driving capacities of the two CMOS inverter circuits 21 and 22 of the first prebuffer circuit 12A are set at a ratio of 1 to 9, and the load driving capacities of the two CMOS inverter circuits 31 and 32 of the second prebuffer circuit 12B are set at a ratio of 1 to 9. For this reason, in the wafer test mode, the gate of each of the MOSFETs 42 and 43 in the output buffer circuit 13 is driven by a driving capacity 1/10 that in the normal operation mode. Therefore, the fall or rise time of the output signal from each of the first and second prebuffer circuits 12A and 12B is increased to 10 times that in the normal operation mode, and a rate of change dI/dt (with respect to time) of a current flowing when the MOSFET 42 or 43 in the output buffer circuit 13 is turned on is sufficiently decreased. As a result, noise due to variation in the power source potential Vcc or the ground potential Vss in the IC can be suppressed, and measurement can be satisfactorily performed by a wafer test using the normal test system shown in FIG. 4. Note that since the operation speed is decreased in this wafer test operation, the access time of a memory IC or the like cannot be measured. However, since measurement of DC characteristics, detection of defective memory cells, and the like are main test items to be performed in the wafer test mode, even if the operation speed of an IC itself is decreased, measurement can be performed without a problem.

Figure 8:
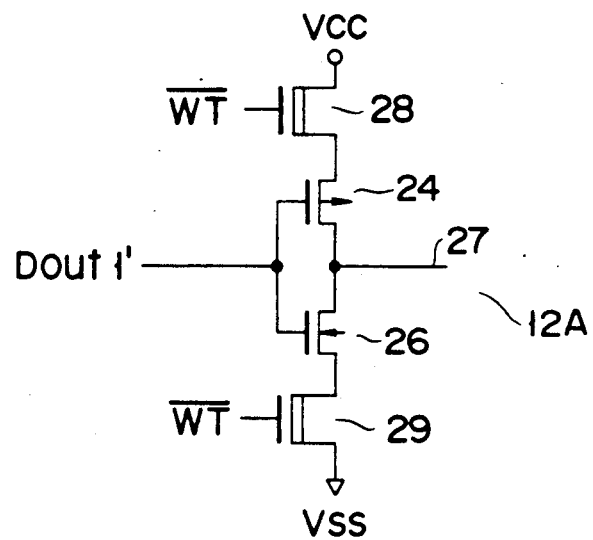
FIG. 8 is a circuit diagram showing an arrangement of a modification of the first embodiment.

FIG. 8 is a circuit diagram showing an arrangement of a modification of the circuit of the above-described embodiment. According to the circuit shown in FIG. 7, in order to change the driving capacities with respect to the gates of the p- and n-channel MOSFETs 42 and 43 in the output buffer circuit 13, the first and second prebuffer circuits 12A and 12B are respectively constituted by the CMOS inverter circuits 21 and 31, and the CMOS inverter circuits 22 and 32 whose operations are controlled by the wafer test signals WT and $\overline{WT}$. In the circuit of this modification, the first prebuffer circuit 12A is modified as shown in FIG. 8. More specifically, in place of the p-channel MOSFET 23, a depletion type n-channel MOSFET 28 is connected between the power source potential Vcc and the output terminal 27. The wafer test signal $\overline{WT}$ is supplied to the gate of the MOSFET 28. In addition, in place of the n-channel MOSFET 25, a depletion type n-channel MOSFET 29 is connected between the ground potential Vss and the output terminal 27. The wafer test signal $\overline{WT}$ is supplied to the gate of the MOSFET 29.

In the first prebuffer circuit 12A having the above-described arrangement, if the wafer test signal $\overline{WT}$ is set at "H" level in the normal operation mode, the ON resistances of the MOSFETs 28 and 29 are sufficiently reduced, and the gate of the p-channel MOSFET 42 in the output buffer circuit 13 can be driven by a sufficiently large driving capacity. In contrast to this, in the wafer test mode, by setting the signal $\overline{WT}$ at "L" level, the ON resistances of the MOSFETs 28 and 29 can be set to be larger than those in the normal operation mode, and the gate of the p-channel MOSFET 42 in the output buffer circuit 13 can be driven by a smaller driving capacity than that in the normal operation mode. A second prebuffer circuit 12B (not shown) in this modification has the same arrangement as that of the first prebuffer circuit 12A except that the input data Dout 1' is replaced by the data Dout 2'.

Figure 9:
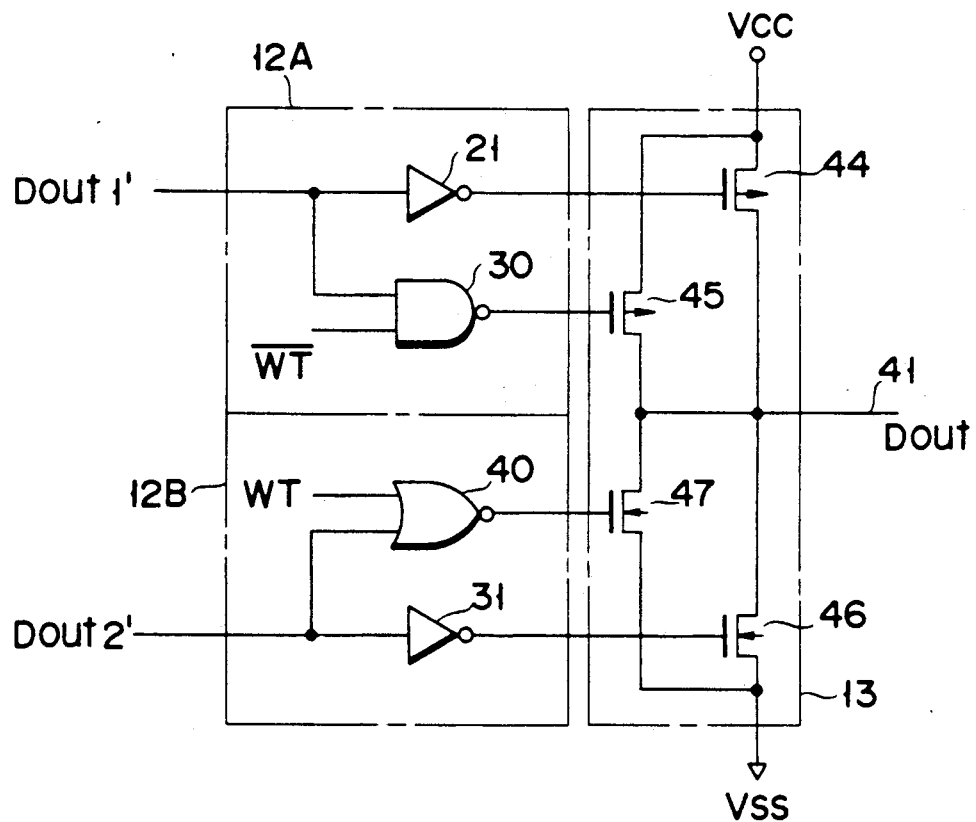
FIG. 9 is a circuit diagram showing a detailed arrangement of a part of a semiconductor IC according to a second embodiment of the present invention.

FIG. 9 shows an arrangement of a second embodiment of the present invention. FIG. 9 is a circuit diagram showing detailed arrangements of the prebuffer circuit 12 and the output buffer circuit 13 shown in FIG. 6. Similarly, FIG. 9 shows only an arrangement of a circuit portion associated with one-bit data. However, identical circuits corresponding to the number of required bits are arranged.

In the circuit of this embodiment, two p-channel MOSFETs 44 and 45, and two n-channel MOSFETs 46 and 47 are arranged in an output buffer circuit 13. In addition, a first prebuffer circuit 12A is constituted by the above CMOS inverter circuit 21 and a CMOS-NAND circuit 30 and a second prebuffer circuit 12B is constituted by the above CMOS inverter circuit 31 and a CMOS-NOR circuit 40.

In the output buffer circuit 13, the sources of the p-channel MOSFETs 44 and 45 are connected to a power source potential Vcc, and their drains are connected to an output terminal 41 for data Dout. The sources of the n-channel MOSFETs 46 and 47 are connected to a ground potential Vss, and their drains are connected to the output terminal 41. An output from the CMOS inverter circuit 21 in the first prebuffer circuit 12A is supplied to the gate of the MOSFET 44 in the output buffer circuit 13. An output from the CMOS-NAND circuit 30 in the first prebuffer circuit 12A is supplied to the gate of the MOSFET 45. The internal data Dout 1' and the wafer test signal $\overline{WT}$ are supplied to the CMOS-NAND circuit 30.

Outputs from the CMOS inverter circuit 31 and the CMOS-NOR circuit 40 in the second prebuffer circuit 12B are respectively supplied to the gates of the MOSFETs 46 and 47 in the output buffer circuit 13. The internal data Dout 2' and the wafer test signal WT are supplied to the CMOS-NOR circuit 40.

In the circuit of this embodiment, the conductances of the two p-channel MOSFETs 44 and 45 in the output buffer circuit 13 are equal to each other, and the sum of the conductances is set to be equal to the conductance of the single MOSFET 42 in the circuit shown in FIG. 7. Similarly, the conductances of the two n-channel MOSFETs 46 and 47 in the output buffer circuit 13 are equal to each other, and the sum of the conductances is set to be equal to the conductance of the single MOSFET 43 in the circuit shown in FIG. 7.

In the circuit having the above-described arrangement, the wafer test signal WT and its inverted signal $\overline{WT}$ are respectively set at "L" level and "H" level in the normal operation mode. As a result, in the first prebuffer circuit 12A, the CMOS-NAND circuit 30 serves as an inverter circuit for inverting the internal data Dout 1', and hence the internal data Dout 1' is inverted by the CMOS inverter circuit 21 and the CMOS-NAND circuit 30 to be supplied to the gates of the p-channel MOSFETs 44 and 45 in the output buffer circuit 13 in parallel Similarly, in the other prebuffer circuit 12B, the CMOS-NOR circuit 40 serves as an inverter circuit for inverting the internal data Dout 2', and hence the internal data Dout 2' is inverted by the CMOS inverter circuit 31 and the CMOS-NOR circuit 40 to be supplied to the gates of the n-channel MOSFETs 46 and 47 in the output buffer circuit 13 in parallel. Therefore, if one internal data Dout 1' is set at "H" level, outputs from both the circuits 21 and 30 in the first prebuffer circuit 12A are at "L" level, and both the MOSFETs 44 and 45 in the output buffer circuit 13 are turned on. As a result, the data Dout at the output terminal 41 quickly rises to "1" level. If the other internal data Dout 2' is set at "0" level, both the circuits 31 and 40 in the second prebuffer circuit 12B are set at "H" level, and both the MOSFETs 46 and 47 in the output buffer circuit 13 are turned on. As a result, the data Dout at the output terminal 41 quickly falls to "0" level. That is, a sufficiently high operation speed can be obtained in the normal operation mode.

In the wafer test mode, the wafer test signal WT and the inverted signal $\overline{WT}$ are respectively set at "H" level and "L" level. Since outputs from the CMOS-NAND circuit 30 and the CMOS-NOR circuit 40 are always set at "H" level and "L" level, respectively, both the p-channel MOSFET 45 and the n-channel MOSFET 47 in the output buffer circuit 13 are set in an OFF state. For this reason, in the wafer test mode, the rate of change dI/dt of a charge/discharge current flowing when the MOSFET 44 or 46 in the output buffer circuit 13 is turned on is satisfactorily reduced, thereby suppressing noise due to variation in the power source potential Vcc or the ground potential Vss in the IC.

FIG. 10 shows an arrangement of a third embodiment of the present invention. FIG. 10 is a circuit diagram showing detailed arrangements of the prebuffer circuit 12 and the output buffer circuit 13 in the circuit shown in FIG. 6. Similarly, FIG. 10 shows only a circuit portion associated with one-bit data. However, identical circuits corresponding to the number of required bits are arranged.

An IC of this embodiment is obtained by combining the circuits of the embodiments described with reference to FIGS. 7 and 9. The same reference numerals in FIG. 10 denote the same parts as in FIG. 7 and 9, and a description thereof will be omitted.

Figure 11:
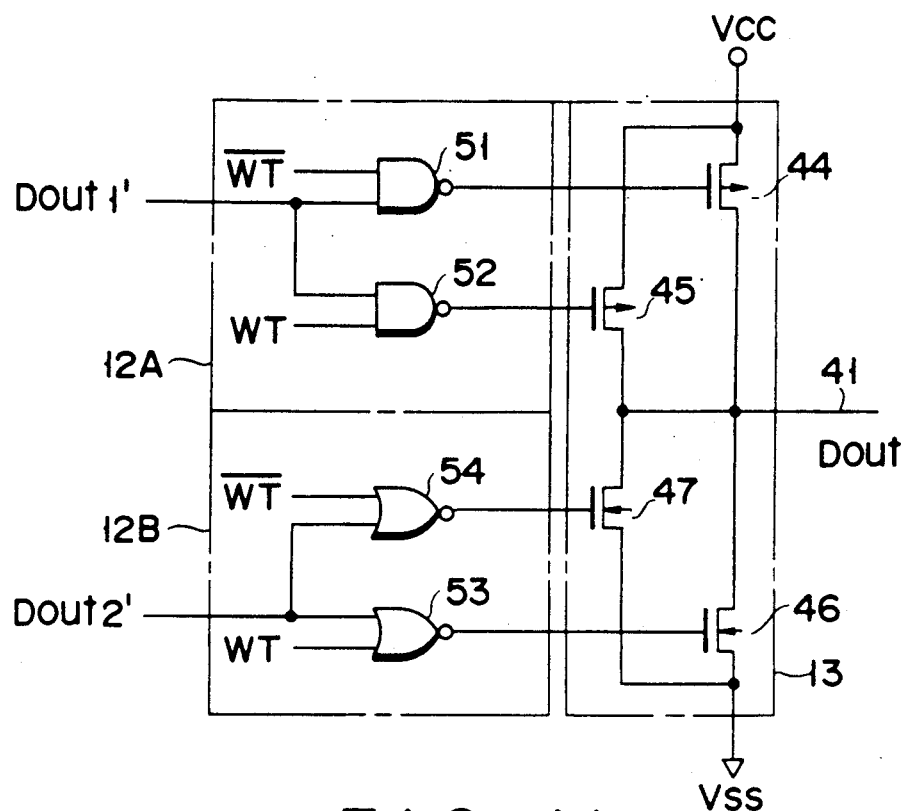
FIG. 11 is a circuit diagram showing a detailed arrangement of a part of a semiconductor IC according to a fourth embodiment of the present invention.

FIG. 11 shows an arrangement of a fourth embodiment of the present invention. FIG. 11 is a circuit diagram showing detailed arrangements of the prebuffer circuit 12 and the output buffer circuit 13 in the circuit shown in FIG. 6. Similarly, FIG. 11 shows only a circuit portion associated with one-bit data However, identical circuits corresponding to the number of required bits are arranged.

In the circuit of this embodiment, similar to the circuit of the embodiment described with reference to FIG. 9, an output buffer circuit 13 is constituted by two p-channel MOSFETs 44 and 45, and two n-channel MOSFETs 46 and 47. However, the conductance of the MOSFET 44 is set to be larger than that of the MOSFET 45, and the conductance of the MOSFET 46 is set to be larger than that of the MOSFET 47.

In addition, the circuit of the fourth embodiment is different from the circuit shown in FIG. 9 in that a circuit equivalent to the first prebuffer circuit 12A is constituted by two CMOS-NAND circuits 51 and 52,. and a circuit equivalent to the second prebuffer circuit 12B is constituted by two CMOS-NOR circuits 53 and 54. One internal data Dout 1' and a wafer test signal $\overline{WT}$ are supplied to the CMOS-NAND circuit 51, and an output therefrom is supplied to the gate of the MOSFET 44 in the output buffer circuit 13. One internal data Dout 1' and a wafer test signal WT are supplied to the CMOS-NAND circuit 52, and an output therefrom is supplied to the gate of the MOSFET 45 in the output buffer circuit 13. The other internal data Dout 2' and the wafer test signal WT are supplied to the CMOS-NOR circuit 53, and an output therefrom is supplied to the gate of the MOSFET 46 in the output buffer circuit 13. The other internal data Dout 2' and the wafer test signal $\overline{WT}$ are supplied to the CMOS-NOR circuit 54, and an output therefrom is supplied to the gate of the MOSFET 47 in the output buffer circuit 13.

In the circuit having the above-described arrangement, the wafer test signal WT and its inverted signal $\overline{WT}$ are respectively set at "L" level and "H" level in the normal operation mode. Therefore, in the first prebuffer circuit 12A, the CMOS-NAND circuit 51 serves as an inverter, and the internal data Dout 1' is inverted thereby to be supplied to the gate of the p-channel MOSFET 44 in the output buffer circuit 13. Similarly, in the second prebuffer circuit 12B, the CMOS-NOR circuit 53 serves as an inverter, and hence the internal data Dout 2' is inverted thereby to be supplied to the gate of the n-channel MOSFET 46 in the output buffer circuit 13. If the internal data Dout 1' is set at "1" level, an output from the first prebuffer circuit 12A is set at "0" level, and the p-channel MOSFET 44 having a larger conductance in the output buffer circuit 13 is turned on. As a result, data Dout output from an output terminal 41 quickly rises to "1" level. In contrast to this, if the other internal data Dout 2' is set at "0" level, an output from the second prebuffer circuit 12B is set at "1" level, and the n-channel MOSFET 46 having a larger conductance in the output buffer circuit 13 is turned on. As a result, the data Dout output from the output terminal 41 quickly falls to "0" level. That is, a sufficiently high operation speed can be obtained in the normal operation mode.

When a wafer test is to be performed, the wafer test signal WT and the inverted signal $\overline{WT}$ are respectively set at "H" level and "L" level At this time, in the first prebuffer circuit 12A, the CMOS-NAND circuit 52 serves as an inverter, and hence the internal data Dout 1' is inverted thereby to be supplied to the gate of the MOSFET 45 having a smaller conductance in the output buffer circuit 13. Similarly, in the second prebuffer circuit 12B, the CMOS-NOR circuit 54 serves as an inverter, and hence the internal data Dout 2' is inverted thereby to be supplied to the MOSFET 47 having a smaller conductance in the output buffer circuit 13. As a result, in the wafer test mode, the output terminal 41 is charged/discharged through the MOSFET 45 or 47 having a smaller conductance in the output buffer circuit 13. Therefore, the rate of change dI/dt of a current flowing through the output buffer circuit 13 is sufficiently reduced.

Figure 12:
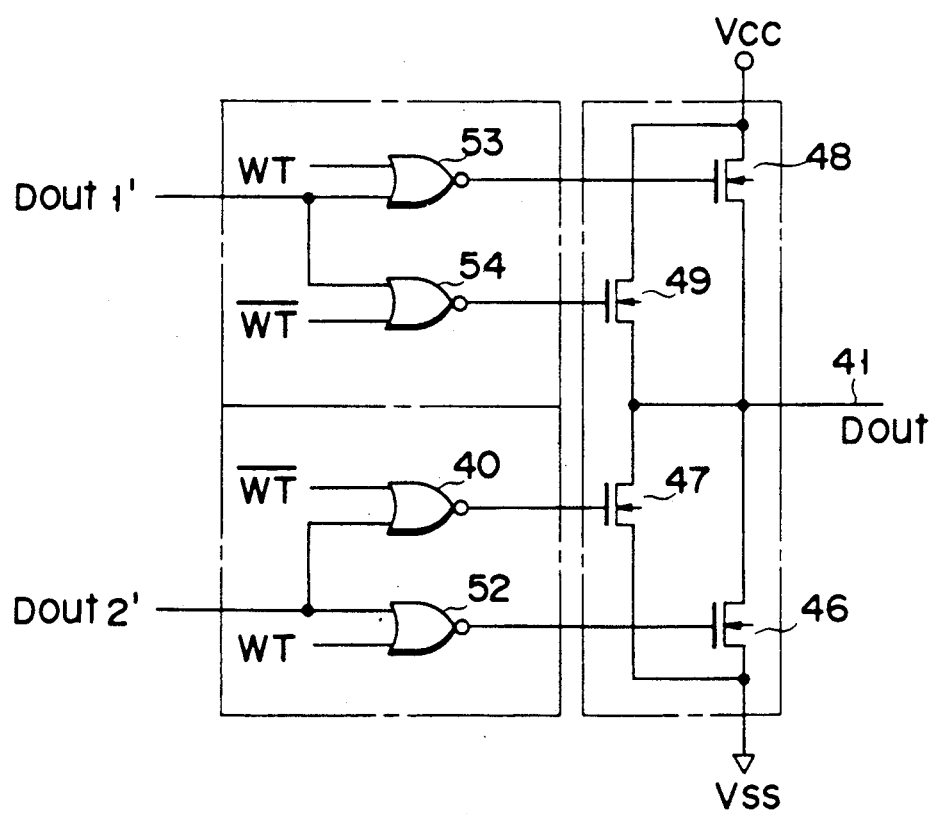
FIG. 12 is a circuit diagram showing a detailed arrangement of a modification of the fourth embodiment.

FIG. 12 is a circuit diagram showing an arrangement of a modification of the circuit of the embodiment described with reference to FIG. 11. In the circuit of this modification, n-channel MOSFETs 48 and 49 are used in place of the p-channel MOSFETs 44 and 45. That is, the output buffer circuit 13 in the circuit of the modification is constituted by only n-channel MOSFETs. Similarly, in this case, the conductance of the MOSFET 48 is set to be larger than that of the MOSFET 49.

In accordance with the above-described modification, a first prebuffer circuit 12A comprises two CMOS-NOR circuits 53 and 54 in place of the CMOS-NAND circuits 51 and 52. Internal data Dout 1' and a wafer test signal WT are supplied to the CMOS-NOR circuit 53, and the internal data Dout 1' and a wafer test signal $\overline{WT}$ are supplied to the CMOS-NOR circuit 54.

FIG. 13 shows a circuit for generating the wafer test signals WT and $\overline{WT}$ used in the circuits of the above-described embodiments. Referring to FIG. 13, reference numeral 61 denotes an input pad to be set at "H" level at the time of the wafer test mode. The input pad 61 is normally set at "L" level of the ground potential Vss by a resistor 62 having a high resistance. When an internal chip enable signal CE' is set at "L" level, an output from a NOR circuit 63 is set at "H" level; an output from an inverter circuit 64 for inverting the output from the circuit 63, i.e., the wafer test signal WT, at "H" level; and an output from an inverter circuit 65 for inverting the output from the circuit 64, i.e., the inverted signal $\overline{WT}$, at "L" level. In the wafer test mode, the input pad 61 is set at "H" level, and the signals WT and $\overline{WT}$ are respectively set at "L" level and "H" level FIG. 14 shows another circuit for generating the wafer test signals WT and $\overline{WT}$ used in the circuit of the above-described embodiments. Referring to FIG. 14, reference numeral 71 denotes an input pad for supplying a normal control signal to the IC. In the wafer test mode, a signal having a level sufficiently higher than that of a normal control signal, i.e., higher than the potentials Vss and Vcc is supplied to the input pad 71. The source-drain paths of two p-channel MOSFETs 72 and 73 and one n-channel MOSFET 74 are connected in series between the input pad 71 and the ground potential Vss. One input terminal of a NAND circuit 75 is connected to the node between the MOSFETs 73 and 74.

A predetermined bias voltage Vb is applied to the gate of the MOSFET 73. When an internal chip enable signal CE' is set at "L" level and a voltage which is higher than the bias voltage Vb by the sum of the threshold voltages of two p-channel MOSFETs is applied to the input pad 71 in the wafer test mode, an output from the NAND circuit 75 is set at "L" level; an output from an inverter circuit 76 for inverting the output from the circuit 75, i.e., the wafer test signal WT, at "H" level; and an output from an inverter circuit 77 for inverting the output from the circuit 76, i.e., the signal $\overline{WT}$, at "L" level.

A case wherein the present invention is applied to a programmable nonvolatile memory IC having a normal data read mode and a programming mode accompanied by a verify operation will be described below.

FIG. 15 is a block diagram showing a schematic arrangement of a nonvolatile memory IC to which the present invention is applied. Referring to FIG. 15, reference numeral 15 denotes a programmable memory circuit using nonvolatile transistors as memory cells. A data read mode for performing a normal data read operation and a programming mode for performing data programming are set in the memory circuit 15. In the programming mode, a verify operation is performed with a high power source voltage as described above. Data read out from the memory circuit 15 is supplied to a prebuffer circuit 12 in the same manner as in the circuit in FIG. 6. The prebuffer circuit 12 amplifies the data read out from the memory circuit 15. An output from the prebuffer circuit 12 is supplied to an output buffer circuit 13. The output buffer circuit 13 externally outputs the readout data on the basis of the output from the prebuffer circuit 12. Reference numeral 14 denotes a mode detecting circuit. The mode detecting circuit 14 detects the two operation mode states of the memory circuit 15 on the basis of an external input signal. A detection output from the mode detecting circuit 14 is supplied to the prebuffer circuit 12. The driving capacity of the prebuffer circuit 12 with respect to the output buffer circuit 13 or the driving capacity of the output buffer circuit 13 with respect to an external load is set in accordance with the detection output.

The prebuffer circuit 12 and the output buffer circuit 13 of the nonvolatile memory IC having the above-described arrangement respectively have the same arrangements as those of the circuits of the IC in FIG. 6 using the first and second prebuffer circuits shown in FIG. 7, 9, 10, 11, 12, or 8. According to this nonvolatile memory IC, however, data read out from the memory circuit 15 are supplied as the internal data Dout 1' and Dout 2'. In addition, the wafer test signals WT and $\overline{WT}$ are used as signals representing the read mode and the programming mode.

An operation of the circuit of this embodiment which employs circuits having the arrangements shown in FIG. 7 as a prebuffer circuit 12 and an output buffer circuit 13 will be described below. In the normal data read mode, the detection signal WT from the mode detecting circuit 14 is set at "L" level; and the signal $\overline{WT}$, at "H" level. At this time, in the first prebuffer circuit 12A, the internal data Dout 1' is inverted by two CMOS inverter circuits 21 and 22. In the second prebuffer circuit 12B, the internal data Dout 2' is inverted by two CMOS inverter circuits 31 and 32. As a result, in this case, the load driving capacity of the prebuffer circuit 12 with respect to the output buffer circuit 13 is increased, and output data Dout quickly rises to "1" level or quickly falls to "0" level. That is, when a normal data read operation is to be performed in the memory circuit 15, since the output buffer circuit 13 is driven by the prebuffer circuit 12 with a sufficiently large capacity, the access time can be satisfactorily shortened.

An operation of the programming mode will be described below. When this mode is set, the detection signal WT from the mode detecting circuit 14 is set at "1" level; and the signal $\overline{WT}$, at "0" level. At this time, in the first and second prebuffer circuits 12A and 12B, the CMOS inverter circuits 22 and 32 do not operate. That is, the internal data Dout 1' and Dout 2' are respectively inverted by only the CMOS inverter circuits 21 and 31. Hence, each of the MOSFETs 42 and 43 of the output buffer circuit 13 is driven by a driving capacity 1/10 that in the normal data read mode. Therefore, a rate of change dI/dt of a current flowing when the p-channel MOSFET 42 or the n-channel MOSFET 43 in the output buffer circuit 13 is turned on is satisfactorily reduced. As a result, noise due to variation in the power source potential Vcc or the ground potential Vss in the IC can be suppressed. Even if programming is performed by using an EPROM programmer for low or intermediate speed, the problem of an operation error due to noise need not be considered, and a verify operation can be satisfactorily performed. Note that a verify operation in the programming mode is normally performed while the operation speed is decreased, and hence measurement of an access time cannot be performed. However, since a verify operation to be performed by an EPROM programmer is designed to check whether a sufficient amount of data is written in each selected cell, no problem is posed in measurement performed while the operation speed of an IC itself is decreased.

A detailed arrangement of a circuit for generating the signals WT and $\overline{WT}$ used by the above-described nonvolatile memory IC will be described below with reference to FIG. 16.

The power source potential Vcc or the high power source voltage potential Vpp can be used as a factor for detecting the operation mode of the memory circuit 15. More specifically, as described with reference to the flow chart in FIG. 5, when a verify operation in the programming mode is performed, the value of the power source potential Vcc is increased from 5 V in the normal data read mode to about 6.25 V, and the value of the high power source voltage potential Vpp is increased from 5 V in the normal data read mode to about 12.7 V. Therefore, mode detection can be performed by detecting the value of the potential Vcc or Vpp.

FIG. 16 shows a circuit arrangement of a mode detecting circuit 14 for performing mode detection by detecting the value of the high power source voltage potential Vpp. More specifically, two p-channel MOSFETs 82 and 83 and one n-channel MOSFET 84 are connected in series between an input terminal 81 for receiving the potential Vpp and the ground potential Vss. Two CMOS inverters 86 and 87 are series-connected to a node 85 of the MOSFETs 83 and 84. The gate and the drain of the MOSFET 82 are connected to each other. The power source potential Vcc is applied to the gates of the MOSFETs 83 and 84. The detection signal $\overline{WT}$ is obtained as an output from the inverter 86, and the detection signal WT is obtained as an output from the inverter 87. Note that a conductance $\beta p$ of each of the p-channel MOSFETs 82 and 83 is set to be sufficiently larger than a conductance $\beta n$ of the n-channel MOSFET 84.

In this mode detecting circuit, in the normal data read mode, a voltage of 5 V is applied to the input terminal 81. At this time, since $Vpp - 2Vthp \leq Vcc$ (where Vthp is the threshold voltage of each p-channel MOSFET), the MOSFET 83 is turned off. However, since the MOSFET 84 is turned on, the potential of the node 85 set at the potential Vss of 0 V. As a result, the detection signal $\overline{WT}$ output from the inverter 86 is set at "H" level, and the detection signal WT output from the inverter 87 is set at "L" level.

In the programming mode, a voltage of about 12.75 V is applied to the input terminal 81. At this time, since $Vpp - 2Vthp > Vcc$, the MOSFET 83 is turned on. In addition, the MOSFET 84 is turned on. However, since $\beta p > \beta n$, the voltage at the node 85 is increased to a high voltage near the potential Vpp. As a result, the detection output $\overline{WT}$ from the inverter 86 is set at "L" level, and the detection output WT from the inverter 87 is set at "H" level.

What is claimed is:

1. A semiconductor integrated circuit having a test mode in addition to a normal mode, comprising:
    mode detecting means for detecting the test mode or normal mode and generating a mode signal corresponding to the detected mode;
    prebuffer means, having at least two selectable output driving capacities, for receiving the mode signal generated by said detecting means, the prebuffer means including means for amplifying an input signal in accordance with an output driving capacity corresponding to the mode signal, and for outputting the amplified signal; and output buffer means for receiving the amplified signal output from said prebuffer means and for outputting the amplified signal.

2. A circuit according to claim 1, wherein said prebuffer means comprises:
a first prebuffer circuit including a first CMOS inverter circuit for receiving a first input signal, and a second CMOS inverter circuit for receiving the first input signal, said second CMOS inverter circuit having an output terminal commonly connected to an output terminal of said first CMOS inverter circuit and being controlled in accordance with first and second mode signals, and
a second prebuffer circuit including a third CMOS inverter circuit for receiving a second input signal, and
a fourth CMOS inverter circuit for receiving the second input signal, said fourth CMOS inverter circuit having an output terminal commonly connected to an output terminal of said third CMOS inverter circuit and being controlled in accordance with the first and second mode signals; and
said output buffer means comprises:
a first MOSFET of a first conductivity type having a source, a drain, and a gate respectively connected to a first potential, an output terminal for data, and the common output terminal of said first and second CMOS inverter circuits; and
a second MOSFET of a second conductivity type having a source, a drain, and a gate respectively connected to a second potential, said output terminal for data, and the common output terminal of said third and fourth CMOS inverter circuits.

3. A circuit according to claim 2, wherein each of said second and fourth CMOS inverter circuits comprises:
an enhancement type first MOSFET of the first conductivity type having a source, a drain, and a gate, the source being connected to the first potential, and the first mode signal being supplied to the gate;
an enhancement type second MOSFET of the first conductivity type having a source, a drain, and a gate, the source and the drain being respectively connected to the drain of said first MOSFET and an output terminal, and the first or second input signal being supplied to the gate;
an enhancement type third MOSFET of the second conductivity type having a source, a drain, and a gate, the source being connected to the second potential, and the second mode signal being supplied to the gate; and
an enhancement type forth MOSFET of the second conductivity type having a source, a drain, and a gate, the source and the drain being respectively connected to the drain of said third MOSFET and the output terminal, and the first or second mode signal being supplied to the gate.

4. A circuit according to claim 2, wherein each of said first and second CMOS inverter circuits comprises:
a depletion type first MOSFET having a source, a drain, and a gate, the source being connected to the first potential, and the mode signal being supplied to the gate;
an enhancement type second MOSFET of the first conductivity type having a source, a drain, and a gate, the source and the drain being respectively connected to the drain of said first MOSFET and an output terminal, and the first or second input signal being supplied to the gate;
a depletion type third MOSFET having a source, a drain, and a gate, the source being connected to the second potential, and the mode signal being supplied to the gate; and
an enhancement type fourth MOSFET of the second conductivity type having a source, a drain, and a gate, the source and the drain being respectively connected to the drain of said third MOSFET and the output terminal, and the first or second input signal being supplied to the gate.

5. A semiconductor integrated circuit having a test mode in addition to a normal mode, comprising:
mode detecting means for detecting the test mode or normal mode and generating a mode signal corresponding to the detected mode;
output buffer means whose driving capacity with respect to an external load is selectively set to one of at least two selectable output driving capacities to drive the external load by using a selected driving capacity, thereby outputting data; and
prebuffer means for receiving the mode signal generated by said mode detecting means, for selecting a driving capacity of said output buffer means in accordance with the mode signal, the prebuffer means including means for amplifying an input signal in accordance with an output driving capacity of said output buffer means corresponding to the mode signal, and for supplying the amplified signal to said output buffer means.

6. A circuit according to claim 5, wherein said prebuffer means comprises:
a first prebuffer circuit including a first CMOS inverter circuit for receiving a first input signal, and a CMOS-NAND circuit for receiving the first input signal and a first mode signal, and
a second prebuffer circuit including a second CMOS inverter circuit for receiving a second input signal, and
a CMOS-NOR circuit for receiving the second input signal and a second mode signal; and
said output buffer means comprises:
a first MOSFET of a first conductivity type having a source, a drain, and a gate respectively connected to the first potential, an output terminal for data, and an output terminal of said first CMOS inverter circuit,
a second MOSFET of the first conductivity type having a source, a drain, and a gate respectively connected the first potential, the output terminal for data, and an output terminal of said CMOS-NAND circuit,
a third MOSFET of a second conductivity type having a source, a drain, and a gate respectively connected to a second potential, the output terminal for data, and an output terminal of said second CMOS inverter circuit, and
a fourth MOSFET of the second conductivity type having a source, a drain, and a gate respectively connected to the second potential, the output terminal for data, and an output terminal of said CMOS-NOR circuit.

7. A circuit according to claim 5, wherein said prebuffer means comprises:
a first prebuffer circuit including a first CMOS inverter circuit for receiving a first input signal, a second CMOS inverter circuit for receiving the first input signal, said second CMOS inverter circuit having an output terminal commonly connected to an output terminal of said first CMOS inverter circuit and being controlled in accordance with first and second mode signals, and a CMOS-NAND circuit for receiving the first input signal and the second mode signal, and a second prebuffer circuit including a third CMOS inverter circuit for receiving a second input signal, a fourth CMOS inverter circuit for receiving the second input signal, said fourth CMOS inverter circuit having an output terminal commonly connected to an output terminal of said third CMOS inverter circuit and being controlled in accordance with the first and second mode signals, and a CMOS-NOR circuit for receiving the second input signal and the first mode signal; and said output means comprises:

a first MOSFET of a first conductivity type having a source, a drain, and a gate respectively connected to a first potential, an output terminal for data, and the common output terminal of said first and second CMOS inverter circuits, a second MOSFET of the first conductivity type having a source, a drain, and a gate respectively connected to the first potential, the output terminal for data, and an output terminal of said CMOS-NAND circuit, a third MOSFET of a second conductivity type having a source, a drain, and a gate respectively connected to a second potential, the output terminal for data, and the common output terminal of said third and fourth CMOS inverter circuits, and a fourth MOSFET of the second conductivity type having a source, a drain, and a gate respectively connected to the second potential, the output terminal for data, and an output terminal of said CMOS-NOR circuit.

8. A semiconductor integrated circuit having a test mode in addition to a normal mode, comprising:

mode detecting means for detecting the test mode or normal mode and generating a mode signal corresponding to the detected mode;

output buffer means, having at least two selectable driving capacities, whose driving capacity with respect to an external load is selectively set to drive the external load by using a selected driving capacity, thereby outputting data; and prebuffer means for receiving the mode signal generated by said mode detecting means, for selecting a driving capacity of said output buffer means in accordance with the mode signal, the prebuffer means including means for amplifying an input signal, and for supplying the amplified signal to said output buffer means.

9. A circuit according to claim 8, wherein said prebuffer means comprises:

a first prebuffer circuit including a first CMOS-NAND circuit for receiving a first input signal and a first mode signal, and a second CMOS-NAND circuit for receiving the first input signal and a second mode signal, and a second prebuffer circuit including a first CMOS-NOR circuit for receiving a second input signal and the second mode signal, and a second CMOS-NOR circuit for receiving the second input signal and the first mode signal; and said output buffer means comprises:

a first MOSFET of a first conductivity type having a source, a drain, and a gate respectively connected to the first potential, an output terminal for data, and an output terminal of said first CMOS-NAND circuit, a second MOSFET of the first conductivity type having a source, a drain and a gate respectively connected the first potential, the output terminal for data, and an output terminal of said second CMOS-NAND circuit, a third MOSFET of a second conductivity type having a source, a drain, and a gate respectively connected to a second potential, the output terminal for data, and an output terminal of said first CMOS-NOR circuit, and a fourth MOSFET of the second conductivity type having a source, a drain, and a gate respectively connected to the second potential, the output terminal for data, and an output terminal of said second CMOS-NOR circuit.

10. A circuit according to claim 8, wherein said prebuffer means comprises:

a first prebuffer circuit including a first CMOS-NOR circuit for receiving a first input signal and a first mode signal, and a second CMOS-NOR circuit for receiving the first input signal and a second mode signal, and a second prebuffer circuit including a third CMOS-NOR circuit for receiving a second input signal and the first mode signal, and a fourth CMOS-NOR circuit for receiving the second input signal and the second mode signal; and said output buffer means comprises:

a first MOSFET of a first conductivity type having a source, a drain, and a gate respectively connected to a first potential, an output terminal for data, and an output terminal of said first CMOS-NOR circuit, a second MOSFET of the first conductivity type having a source, a drain, and a gate respectively connected to the first potential, the output terminal for data, and an output terminal of said second CMOS-NOR circuit, a third MOSFET of the first conductivity type having a source, a drain, and a gate respectively connected to a second potential, the output terminal for data, and an output terminal of said third CMOS-NOR circuit, and a fourth MOSFET of the first conductivity type having a source, a drain, and a gate respectively connected to the second potential, the output terminal for data, and an output terminal of said fourth CMOS-NOR circuit.

11. A semiconductor integrated circuit comprising:

a programmable nonvolatile memory circuit having a normal data read mode and a programming mode accompanied by a verify operation;

mode detecting means for detecting an operation mode of said nonvolatile memory circuit and generating a mode signal corresponding to the detected mode;

prebuffer means, having at least two selectable output driving capacities, for receiving the mode signal generated by said mode detecting means, the prebuffer means including means for amplifying data read out from said nonvolatile memory circuit in accordance with an output driving capacity corresonding to the mode signal, and for outputting the amplified data; and output buffer means for receiving the amplified data output from said prebuffer means, and for externally outputting the data read out from asid nonvolatile memory circuit.

12. A circuit according to claim 11, wherein said prebuffer means comprises:
a first prebuffer circuit including a first CMOS inverter circuit for receiving a first input signal, and a second CMOS inverter circuit for receiving the first input signal, said second CMOS inverter circuit having an output terminal commonly connected to an output terminal of said first CMOS inverter circuit and being controlled in accordance with first and second mode signals, and a second prebuffer circuit including a third CMOS inverter circuit for receiving a second input signal, and a fourth CMOS inverter circuit for receiving the second input signal, said fourth CMOS inverter circuit having an output terminal commonly connected to an output terminal of said third CMOS inverter circuit and being controlled in accordance with the first and second mode signals; and said output buffer means comprises:
a first MOSFET of a first conductivity type having a source, a drain, and a gate respectively connected to a first potential, an output terminal for data, and the common output terminal of said first and second CMOS inverter circuits; and a second MOSFET of a second conductivity type having a source, a drain, and a gate respectively connected to a second potential, said output terminal for data, and the common output terminal of said third and fourth CMOS inverter circuits.

13. A circuit according to claim 12, wherein each of said second and fourth CMOS inverter circuits comprises:
an enhancement type first MOSFET of the first conductivity type having a source, a drain, and a gate, the source being connected to the first potential, and the first mode signal being supplied to the gate;
an enhancement type second MOSFET of the first conductivity type having a source, a drain, and a gate, the source and the drain being respectively connected to the drain of said first MOSFET and an output terminal, and the first or second input signal being supplied to the gate;
an enhancement type third MOSFET of the second conductivity type having a source, a drain, and a gate, the source being connected to the second potential, and the second mode signal being supplied to the gate; and
an enhancement type forth MOSFET of the second conductivity type having a source, a drain, and a gate, the source and the drain being respectively connected to the drain of said third MOSFET and the output terminal, and the first or second mode signal being supplied to the gate.

14. A circuit according to claim 12, wherein each of said first and second CMOS inverter circuits comprises:
a depletion type first MOSFET having a source, a drain, and a gate, the source being connected to the first potential, and the mode signal being supplied to the gate;
an enhancement type second MOSFET of the first conductivity type having a source, a drain, and a gate, the source and the drain being respectively connected to the drain of said first MOSFET and an output terminal, and the first or second input signal being supplied to the gate;
a depletion type third MOSFET having a source, a drain, and a gate, the source being connected to the second potential, and the mode signal being supplied to the gate; and
an enhancement type fourth MOSFET of the second conductivity type having a source, a drain, and a gate, the source and the drain being respectively connected to the drain of said third MOSFET and the output terminal, and the first or second input signal being supplied to the gate.

15. A semiconductor integrated circuit comprising:
a programmable nonvolatile memory circuit having a normal data read mode and a programming mode accompanied by a verify operation;
mode detecting means for detecting an operation mode of said nonvolatile memory circuit and generating a mode signal corresponding to the detected mode;
output buffer means, having a plurality of types of driving capacities to be selectively set with respect to an external load, for driving the external load by using a selected driving capacity and for outputting data read out from said nonvolatile memory circuit; and
prebuffer means for receiving the mode signal generated by said mode detecting means and for selecting a driving capacity of said output buffer means in accordance with the mode signal, the prebuffer means including means for amplifying the data read out from said nonvolatile memory circuit in accordance with the driving capacity corresponding to the mode signal, and supplying the amplified output to said data buffer means.

16. A circuit according to claim 15, wherein said prebuffer means comprises:
a first prebuffer circuit including a first CMOS inverter circuit for receiving a first input signal, and
a CMOS-NAND circuit for receiving the first input signal and a first mode signal, and
a second prebuffer circuit including a second CMOS inverter circuit for receiving a second input signal, and
a CMOS-NOR circuit for receiving the second input signal and a second mode signal; and
said output buffer means comprises:
a first MOSFET of a first conductivity type having a source, a drain, and a gate respectively connected to the first potential, an output terminal for data, and an output terminal of said first CMOS inverter circuit,
a second MOSFET of the first conductivity type having a source, a drain, and a gate respectively connected the first potential, the output terminal for data, and an output terminal of said CMOS-NAND circuit,
a third MOSFET of a second conductivity type having a source, a drain, and a gate respectively connected to a second potential, the output terminal for data, and an output terminal of said second CMOS inverter circuit, and
a fourth MOSFET of the second conductivity type having a source, a drain, and a gate respectively connected to the second potential, the output terminal for data, and an output terminal of said CMOS-NOR circuit.

17. A circuit according to claim 15, wherein said prebuffer means comprises:
a first prebuffer circuit including a first CMOS inverter circuit for receiving a first input signal,
a second CMOS inverter circuit for receiving the first input signal, said second CMOS inverter circuit having an output terminal commonly connected to an output terminal of said first CMOS inverter circuit and being controlled in accordance with first and second mode signals, and
a CMOS-NAND circuit for receiving the first input signal and the second mode signal, and
a second prebuffer circuit including a third CMOS inverter circuit for receiving a second input signal,
a fourth CMOS inverter circuit for receiving the second input signal, said fourth CMOS inverter circuit having an output terminal commonly connected to an output terminal of said third CMOS inverter circuit and being controlled in accordance with the first and second mode signals, and
a CMOS-NOR circuit for receiving the second input signal and the first mode signal; and
said output means comprises:
a first MOSFET of a first conductivity type having a source, a drain, and a gate respectively connected to a first potential, an output terminal for data, and the common output terminal of said first and second CMOS inverter circuits,
a second MOSFET of the first conductivity type having a source, a drain, and a gate respectively connected to the first potential, the output terminal for data, and an output terminal of said CMOS-NAND circuit,
a third MOSFET of a second conductivity type having a source, a drain, and a gate respectively connected to a second potential, the output terminal for data, and the common output terminal of said third and fourth CMOS inverter circuits, and
a fourth MOSFET of the second conductivity type having a source, a drain, and a gate respectively connected to the second potential, the output terminal for data, and an output terminal of said CMOS-NOR circuit.

18. A semiconductor integrated circuit comprising:
a programmable nonvolatile memory circuit having a normal data read mode and a programming mode accmopanied by a verify operation;
mode detecting means for detecting an operation mode of said nonvolatile memory circuit and generating a mode signal corresponding to the detected mode;
output buffer means, having a plurality of types of driving capacities to be selectively set with respect to an external load, for driving the external load in accordance with a selected driving capacity and for ouputting data read out from said nonvolatile memory circuit; and
prebuffer means for receiving the mode signal generated by said mode detecting means and for selecting a driving capacity of said output buffer means in accordance with the mode signal, the prebuffer means including means for amplifying the data read out from said nonvolatile memory circuit, and for supplying the amplified data to said output buffer means.

19. A circuit according to claim 18, wherein said prebuffer means comprises:
a first prebuffer circuit including a first CMOS-NAND circuit for receiving a first input signal and a first mode signal, and
a second CMOS-NAND circuit for receiving the first input signal and a second mode signal, and
a second prebuffer circuit including a first CMOS-NOR circuit for receiving a second input signal and the second mode signal, and
a second CMOS-NOR circuit for receiving the second input signal and the first mode signal; and
said output buffer means comprises:
a first MOSFET of a first conductivity type having a source, a drain, and a gate respectively connected to the first potential, an output terminal for data, and an output terminal of said first CMOS-NAND circuit,
a second MOSFET of the first conductivity type having a source, a drain and a gate respectively connected the first potential, the output terminal for data, and an output terminal of said second CMOS-NAND circuit,
a third MOSFET of a second conductivity type having a source, a drain, and a gate respectively connected to a second potential, the output terminal for data, and an output terminal of said first CMOS-NOR circuit, and
a fourth MOSFET of the second conductivity type having a source, a drain, and a gate respectively connected to the second potential, the output terminal for data, and an output terminal of said second CMOS-NOR circuit.

20. A circuit according to claim 18, wherein said prebuffer means comprises:
a first prebuffer circuit including a first CMOS-NOR circuit for receiving a first input signal and a first mode signal, and
a second CMOS-NOR circuit for receiving the first input signal and a second mode signal, and
a second prebuffer circuit including a third CMOS-NOR circuit for receiving a second input signal and the first mode signal, and
a fourth CMOS-NOR circuit for receiving the second input signal and the second mode signal; and
said output buffer means comprises:
a first MOSFET of a first conductivity type having a source, a drain, and a gate respectively connected to a first potential, an output terminal for data, and an output terminal of said first CMOS-NOR circuit,
a second MOSFET of the first conductivity type having a source, a drain, and a gate respectively connected to the first potential, the output terminal for data, and an output terminal of said second CMOS-NOR circuit,
a third MOSFET of the first conductivity type having a source, a drain, and a gate respectively connected to a second potential, the output terminal for data, and an output terminal of said third CMOS-NOR circuit, and
a fourth MOSFET of the first conductivity type having a source, a drain, and a gate respectively connected to the second potential, the output terminal for data, and an output terminal of said fourth CMOS-NOR circuit.

* * * * *